United States Patent [19]

Belforte

[11] Patent Number: 4,593,211

[45] Date of Patent: Jun. 3, 1986

[54] LOW-DISSIPATION OUTPUT STAGE FOR BINARY TRANSMITTERS

[75] Inventor: Piero Belforte, Turin, Italy

[73] Assignee: Cselt - Centro Studi e Laboratori Telecommunicazioni S.p.A., Turin, Italy

[21] Appl. No.: 552,499

[22] Filed: Nov. 17, 1983

[30] Foreign Application Priority Data

Nov. 24, 1982 [IT] Italy .................. 68364 A/82

[51] Int. Cl.$^4$ ......................................... H03K 19/086
[52] U.S. Cl. ................... 307/455; 307/443; 307/454; 307/475; 307/296 R
[58] Field of Search ............. 307/443, 454, 455, 467, 307/475, 296 R, 457

[56] References Cited

U.S. PATENT DOCUMENTS

| | | | |
|---|---|---|---|
| 3,758,791 | 9/1973 | Taniguchi et al. | 307/455 X |
| 3,909,636 | 9/1975 | Masaki et al. | 307/455 |
| 3,978,347 | 8/1976 | Hollstein et al. | 307/455 |
| 4,039,867 | 8/1977 | Blumberg et al. | 307/455 |
| 4,276,485 | 6/1981 | Rydval | 307/455 X |
| 4,286,179 | 8/1981 | Konian et al. | 307/455 |

FOREIGN PATENT DOCUMENTS

| | | |
|---|---|---|
| 3135952 | 4/1983 | Fed. Rep. of Germany . |
| 1465627 | 12/1966 | France . |
| 2409640 | 6/1979 | France . |
| 0048150 | 4/1979 | Japan .................. 307/455 |

OTHER PUBLICATIONS

Cases et al, "Emitter-Coupled Logic Totem-Pole Driver with Multiple Wired Logic Function Capability", IBM Tech. Disc. Bull., vol. 20, No. 9, 2/1979 pp. 3471-3472.

Primary Examiner—Stanley D. Miller
Assistant Examiner—D. R. Hudspeth
Attorney, Agent, or Firm—Karl F. Ross; Herbert Dubno

[57] ABSTRACT

Two driving transistors controlled in push-pull by an input stage responsive to incoming binary signals are connected in a common-collector mode across a direct-current source in series with a high-current generator, with interposition of two switching transistors between this generator and the emitters of the driving transistors. The line wires are tied to these emitters and also to two low-current generators each shunting the combination of the high-current generator with the respective switching transistor. The input stage comprises two control transistors operated in push-pull—directly or via respective pilot transistors—by the incoming signal; the collectors of these control transistors are tied to the bases of the driving transistors while their emitters are joined in parallel to another low-current generator connected in series therewith across the source. The bases of the switching transistors are biased by the input stage to turn either of them on when the respectively associated driving transistor is in a high-impedance state whereby line current passes through the other driving transistor, the conductive switching transistor and the high-current generator.

1 Claim, 4 Drawing Figures

LOW-DISSIPATION OUTPUT STAGE FOR BINARY TRANSMITTERS

FIELD OF THE INVENTION

My present invention relates to a circuit arrangement for the transmission of binary signals over a two-wire line by a technique known in the art as "emitter-coupled logic" (ECL), using an output stage with a pair of layer-type driving transistors connected in the common-collector mode across a source of direct current and operated in push-pull by an associated input stage.

BACKGROUND OF THE INVENTION

In a conventional circuit arrangement of this type, each of the two paired transistors is joined by its emitter to a respective current generator connected in series therewith across the d-c source. The two wires of the transmission line are respectively tied to these emitters to form a loop across a remote load through which line current passes via the momentarily more conductive driving transistor and the current generator in series with the momentarily less conductive transistor which is prevented by that generator from being completely cut off. The total power consumption in the output stage is the sum of the wattages dissipated by the biasing currents of the two generators and the line current traversing the more conductive transistor under the control of the binary signal fed to the input stage. Additional power, but of considerably lesser magnitude, is also consumed in that input stage which generally includes another current generator connected in parallel to the emitters of a pair of control transistors, usually of the same structure and conductivity type as the driving transistors of the output stage, whose collectors are respectively tied to the bases of the driving transistors and are connected via respective resistors to the same source terminal as the collectors of the driving transistors.

This large power consumption not only dissipates considerable electrical energy but also requires the use of transistors capable of sustaining same, which may affect the reliability of their response to the incoming signal. The power-consumption and dimensioning problems are particularly critical when the driving transistors of the output stage are to form part of an integrated circuit included, for example, in a signal transceiver.

OBJECT OF THE INVENTION

The object of my present invention, therefore, is to provide an improved circuit arrangement of the character referred to which can transmit binary signals at high speed with significantly reduced dissipation so as to avoid the aforestated problems.

SUMMARY OF THE INVENTION

I realize this object, in accordance with my present invention, by the provision of a circuit arrangement whose input stage is of the aforedescribed structure with a pair of control transistors connected in series with respective collector resistors and an ancillary current generator between a first and a second terminal of a d-c source but whose output stage differs from the conventional arrangement in that the two driving transistors, whose collectors are connected in parallel to the first source terminal, have their emitters selectively connectable by interposed switchover means to a single principal current generator connected to the second source terminal. The input stage controls the switchover means to connect the principal generator to the emitter of whichever driving transistor is less conductive than the other with a given value of the incoming binary signal supplied to the base of one of the control transistors, the base of the other control transistor being connected to a supply of constant reference voltage which—as known per se—has a magnitude intermediate a low and a high level of the binary signal.

Thus, in a stabilized state, line current passes from the first source terminal through the more conductive driving transistor to one wire and returns on the other wire for passage to the second source terminal via the principal current generator then connected thereto so that dissipation in the output stage is essentially limited to the power consumption of the current emitted by this one principal generator. However, in order to insure continued conduction of both driving transistor, I prefer to insert two supplemental current generators—of considerably lower power than the principal generator—between the second source terminal and the respective line wires.

According to a more particular feature of my invention, the switchover means comprises two switching transistors of the same conductivity type as the driving transistors whose collectors are respectively connected to the two line wires and thus to the emitters of the driving transistors in series therewith. The emitters of the switching transistors are connected in parallel to the principal current generator while their bases are connected to respective biasing circuits extending from the input stage to the second source terminal. The biasing circuits advantageously include the forward resistances of respective diodes inserted between the input state and the bases of the switching transistors in order to introduce a certain voltage offset between the potentials of these bases and the potentials of the points at which the diodes are joined to the input stage; these junction points could be the collectors of the control transistors or the emitters of two pilot transistors through which the binary signal and the reference voltage are transmitted to the bases of the control transistors.

BRIEF DESCRIPTION OF THE DRAWING

The above and other features of my invention will now be described in detail with reference to the accompanying drawing in which.

SPECIFIC DESCRIPTION

Figures 1, 2:
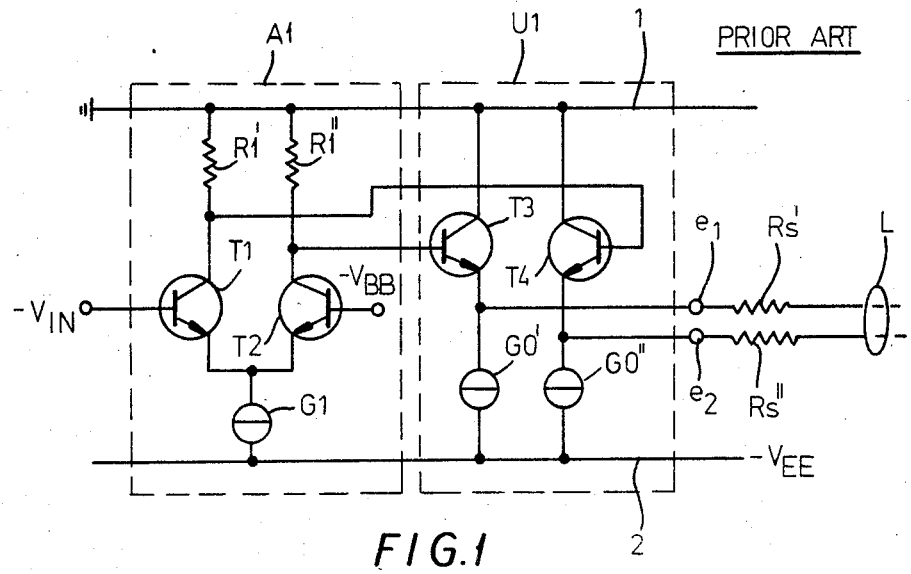
FIG. 1 is a circuit diagram representing a prior-art arrangement for the transmission of a binary signal to a two-wire line with ECL technology.
FIG. 2 is a diagram similar to that of FIG. 1 but showing my present improvement.

As shown in FIG. 1, a conventional ECL-type signal-transmitting system comprises an input stage A1 and an output stage U1 separately connected across a direct-current source which is here represented by a first terminal in the form of a grounded conductor 1 and a second terminal in the form of a negative conductor 2 carrying a voltage $-V_{EE}$, e.g. of $-5$ V. Input stage A1 comprises a pair of NPN control transistors T1 and T2 having collectors connected via respective resistors R1' and R1″ to conductor 1 and having emitters connected via a low-current generator G1 to conductor 2. The base of transistor T1 is connected to an incoming lead carrying a binary signal $-V_{IN}$ which may alternate between a high level of $-0.8$ V and a low level of $-1.6$ V; the base of transistor T2 is tied to a supply of constant reference voltage $-V_{BB}$ whose value lies midway between these two levels, i.e. at $-1.2$ V in the specific instance assumed above.

Output stage U1 comprises two NPN driving transistors T3 and T4 with collectors connected in parallel to conductor 1, bases respectively tied to the collectors of control transistors T1 and T2, and emitters connected via respective high-current generators GO′ and GO″ to conductor 2. The emitter leads of transistors T3 and T4 form respective junctions $e_1$, $e_2$ with wires of a transmission line L including termination resistors Rs′ and Rs″.

In operation, with generators GO′ and GO″ each emitting a current on the order of 10 mA, a high signal level on the base of control transistor T1 will cause virtually the entire current of ancillary generator G1 to pass through that transistor whereby the voltage drop across its collector resistor R1′ nearly cuts off the driving transistor T4 while the base voltage of transistor T3 is substantially at ground level so that its impedance is low. Part of the current now traversing transistor T3 returns through generator GO′ to the source while another part passes over line L through the remote signal receiver and then by way of generator GO″ to conductor 2. The line current, furnished by generator GO″, is therefore of substantially the same magnitude as the return current passing through generator GO′. Thus, the power consumption within stage U1 is on the order of 100 mW under the conditions assumed.

The same power consumption will occur when signal $-V_{IN}$ is at its low level, with control transistor T1 substantially cut off and driving transistor T4 in a low-impedance state whereby the loop current through line L is reversed.

The circuit arrangement of FIG. 2, embodying my present invention, differs from that of FIG. 1 in that its output stage U2 comprises single high-current generator GO which is selectively connectable to the emitter of driving transistor T3 or T4, and thus to line junction $e_1$ or $e_2$, by a switchover circuit or commutator CM controlled from the input stage A1 in a manner more fully described hereinafter. In general terms, switchover circuit CM connects generator GO to the emitter of driving transistor T3, as illustrated diagrammatically, when the conductivity of this transistor is low owing to a low-level incoming signal $-V_{IN}$ which turns on the control transistor T2 and causes driving transistor T4 to carry the line current, the return current from the line passing through switchover circuit CM and generator GO to conductor 2. When the incoming signal goes high, circuit CM commutates into its alternate position while transistor T3 becomes conductive to pass its current over the line in the opposite direction.

Figure 3:
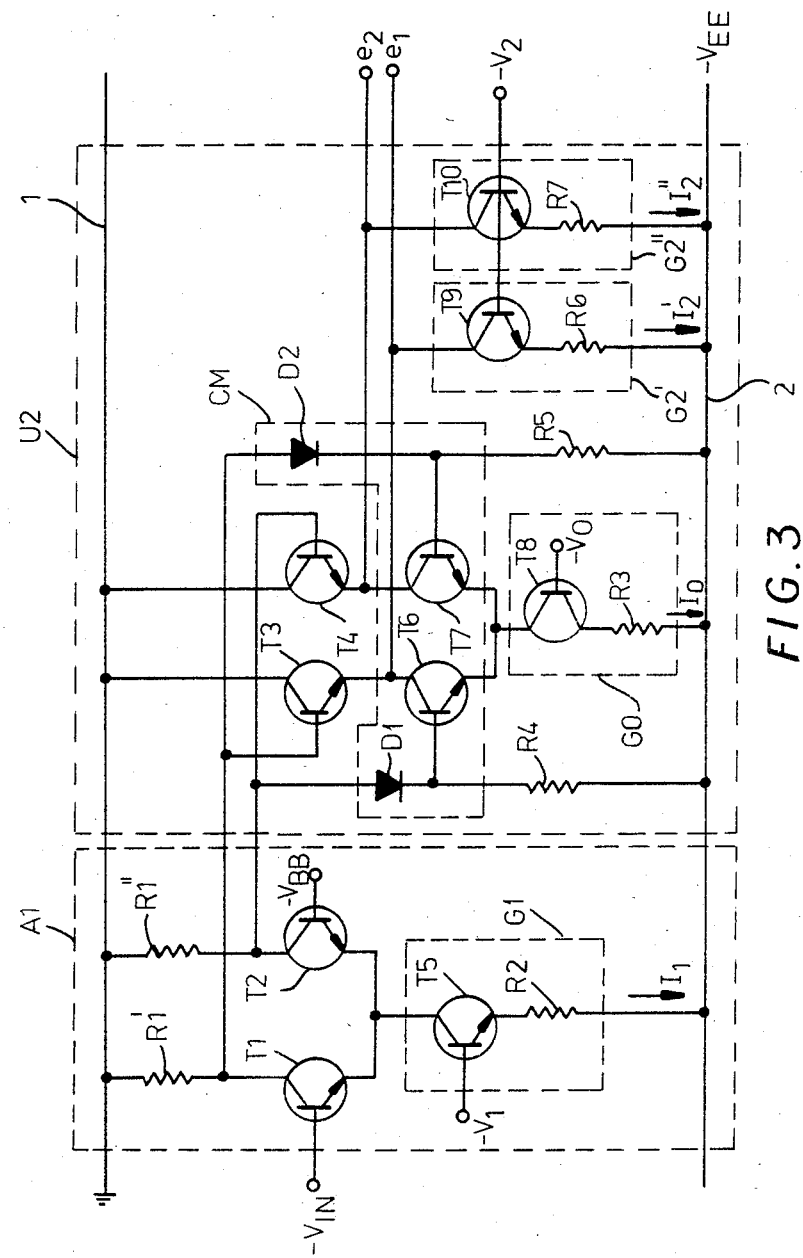
FIG. 3 shows details of a switchover circuit and other components included in the system of FIG. 2.

In FIG. 3 I have shown details of commutator CM forming part of output stage U2. This circuit comprises two NPN switching transistors T6 and T7 lying respectively in series with driving transistors T3 and T4, their emitters being connected in parallel to the collector of another NPN transistor T8 forming part of current generator GO. Transistor T8, whose emitter is connected to negative potential on conductor 2 by way of a resistor R3, has its base biased by a constant voltage $-V_0$ suitably chosen to provide a desired operating current $I_0$ of, say, 10 mA. Voltage $-V_0$ may, of course, be adjustable to accommodate different circuit conditions.

The collectors of switching transistors T6 and T7 are respectively connected to line junctions $e_1$, $e_2$ and thus to the emitters of driving transistors T3 and T4. The base of transistor T6 is connected to the cathode of a diode D1 whose anode is joined to the collector of control transistor T2 and thus to the base of driving transistor T4, the forward resistance of this diode thus forming part of a biasing circuit which further includes a high-ohmic resistor R4 inserted between its cathode and conductor 2. A similar biasing circuit, including a diode D2 in series with a high-ohmic resistor R5, extends between the collector of control transistor T1 and conductor 2; the forward resistance of diode D2, therefore, lies between the bases of transistors T3 and T7. This cross-connection of the two diodes between the bases of driving transistors T3, T4 and those of the respectively opposite switching transistors T7, T6 insures a virtually simultaneous changeover from high to low conductivity, or vice versa, of the two transistors through which the line current must pass with a given value of incoming signal $-V_{IN}$, thereby facilitating signal transmission at high speed.

FIG. 3 further shows two low-current generators G2′ and G2″ respectively inserted between conductor 2 and the emitters of transistors T3 and T4. Ancillary current generator G1 and supplemental generators G2′, G2″ are of essentially identical structure similar to that of generator GO, comprising respective NPN transistors T5, T9 and T10 in series with associated emitter resistors R2, R6 and R7. Fixed biasing voltages $-V_1$ and $-V_2$ respectively applied to the bases of transistor T5 and of transistors T9, T10 are chosen to maintain their operating currents $I_1$ and $I_2'$, $I_2''$ at a small fraction of that of generator GO, e.g. at 1 mA in each instance.

If it is assumed that each collector resistor R1′, R1″ has a magnitude of 800 Ω and that the voltage drop across each diode D1, D2 in the forward direction equals 0.7 V, a high level of incoming signal $-V_{IN}$ ($-0.8$ V) will let virtually the entire operating current $I_1$ of generator G1 pass through transistor T1 so as to produce a voltage of $-0.8$ V on the collector of that control transistor and on the base of driving transistor T3, the base voltage of switching transistor T7 correspondingly assumes a value of $-1.5$ V. Conversely, the substantial cutoff of control transistor T2 brings the base of driving transistor T4 approximately to ground potential while the base of switching transistor T6 is at about $-0.7$ V. The two latter transistors are therefore in their low-impedance state so that line current mainly flows from conductor 1 via transistor T4 to junction $e_2$ and from junction $e_1$ via transistor T6 and principal generator GO to conductor 2. A small additional current passes from transistor T4 through supplemental generator G2″ directly to conductor 2. The continuity of conduction of transistor T3 is maintained by a similarly small flow through supplemental generator G2′ while a minor fraction of the current drawn by generator GO also traverses the switching transistor T7 which is not completely cut off. When signal $-V_{IN}$ goes low, i.e. to $-1.6$ V as herein assumed, the states of conductivity of transistors T1–T4, T6 and T7 are reversed. In either case, however, the power dissipation of stage U2 (aside from the negligible amount caused by the current flow through biasing resistors R4 and R5) will be 60 mW, i.e. 50 mW due to the flow of current $I_0$ through generator GO and 5 Mw each due to the flow of currents $I_2'$ and $I_2''$ through generators $G2'$ and $G2''$. Thus, my present improvement results in an energy saving of almost 50%.

Figure 4:
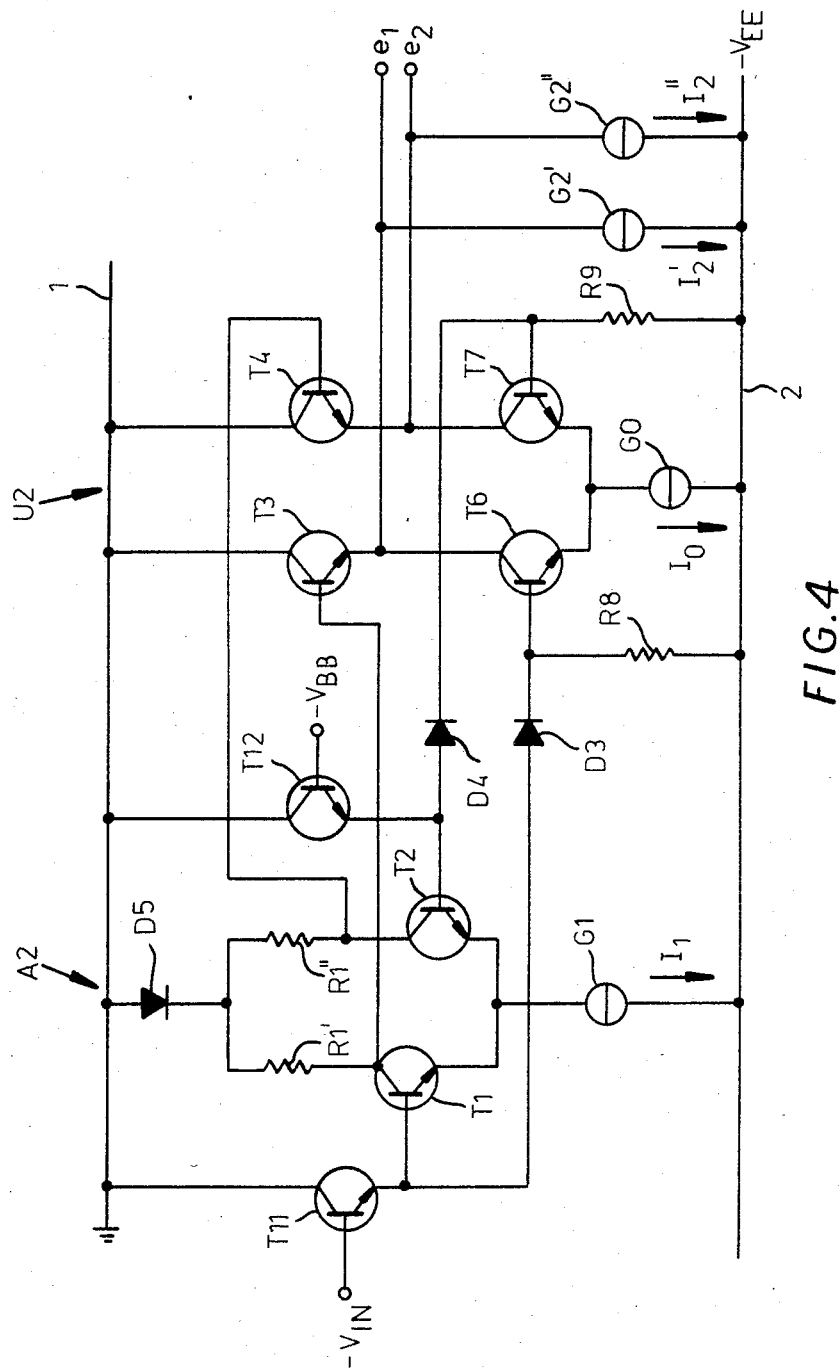
FIG. 4 is a circuit diagram similar to that of FIG. 3, illustrating a modification.

In FIG. 4 I have shown a modified input stage A2 associated with output stage U2, that input stage including two pilot transistors T11 and T12—also of NPN type and operating in a common-collector mode—whose bases respectively receive the incoming signal $-V_{IN}$ and the reference voltage $-V_{BB}$. The emitters of pilot transistors T11 and T12 are tied to the bases of control transistors T1 and T2 whose own emitters, as before, are connected in parallel to low-current generator G1. Two diodes D3 and D4 form part of respective biasing circuits which also include high-ohmic resistors R8 and R9 respectively inserted between conductor 2 and the bases of switching transistors T6 and T7, in a manner identical with that shown for biasing resistors R4 and R5 in FIG. 3. The forward resistance of diode D3 lies between the bases of transistors T1 and T6 while that of diode D4 analogously lies between the bases of transistors T2 and T7. It will be noted that in this instance the collector resistors $R1'$ and $R1''$ are not loaded with the small biasing current passing through the diodes.

The cross-connections described with reference to FIG. 3 are not needed in the embodiment of FIG. 4 since the emitter voltages of pilot transistors T11 and T12 vary inversely with the collector voltages of the associated control transistors T1 and T2. Thus, as in the preceding embodiment, a low-impedance state of driving transistor T3 or T4 is accompanied by a similar state of the nonassociated switching transistor T7 or T6.

Input stage A2 further differs from the corresponding stage A1 of FIGS. 1–3 in that its collector resistors $R1'$ and $R1''$ are connected to ground on conductor 1 by way of an additional diode D5 whose forward voltage drop lowers the collector potential of the nonconducting control transistor to about $-0.8$ V.

With the base/emitter voltage of pilot transistors T11 and T12 assumed to be close to the forward voltage drop across diodes D3 and D4, i.e. about 0.7 V, the presence of a low level of signal $-V_{IN}$ on the base of transistor T11 biases the base of control transistor T1 to about $-2.3$ V while the base of control transistor T2 is invariably maintained at $-1.9$ V by transistor T12 to whose base the reference voltage $-V_{BB}$ of $-1.2$ V is applied. The operating current $I_1$ of generator G1 thus passes virtually exclusively through transistor T2 whereby its collector, and therefore the base of driving transistor T4, assumes a potential of about $-1.6$ V whereas the base of driving transistor T3 is biased to about $-0.8$ V. The bases of switching transistors T6 and T7 carry voltages of $-3$ V and $-2.6$ V, respectively, on account of the voltage drop of 0.7 V across diodes D3 and D4.

Under these conditions, accordingly, line current $I_0$ passes from conductor 1 through transistor T3 to junction $e_1$ and from junction $e_2$ through transistor T7 and generator GO to conductor 2. As before, a small additional current $I_2'$ passes from the line through supplemental generator $G2'$ while a conduction-sustaining current $I_2''$ flows from transistor T4 through supplemental generator $G2''$. When signal $-V_{IN}$ goes high, the roles of the control driving and switching transistors are again reversed within each pair, as are those of pilot transistors T11 and T12. The changeover between transistors T6 and T7 occurs not later and possibly slightly sooner than that of transistors T3 and T4, owing to the way their base potentials vary along with the base and collector potentials of transistors T1 and T2. Thus, the line current may be cut off for very brief instants but there is never an overlap between the low-impedance states of transistor combinations T3, T7 and T4, T6.

The circuitry of output stage U2 may be integrated in a transceiver, as noted above, possibly to the exclusion of current generators GO, $G2'$ and $G2''$.

Obviously, the polarity of the source could be inverted with the use of PNP instead of NPN transistors and reversal of diodes D1–D5.

I claim:

1. A circuit arrangement for transmitting a binary signal over a two-wire line, comprising:

a source of direct current having a first and a second terminal;

an input stage including a pair of control transistors with collectors connected via respective resistors to said first terminal, one of said control transistors having a base connected to be energized by the binary signal to be transmitted, the other of said control transistors being connected to a supply of constant reference voltage having a magnitude intermediate a low and a high level of said binary signal;

two driving transistors with collectors tied to said first terminal, with bases respectively connected to the collectors of said control transistors and with emitters respectively tied to the wires of said line;

a principal current generator connected to said second terminal;

an ancillary current generator connected to said second terminal, said control transistors having emitters connected in parallel to said ancillary current generator;

switchover means inserted between said principal current generator and the emitters of said driving transistors, said switchover means being controlled by said input stage to connect said principal current generator to the emitter of whichever driving transistors is less conductive than the other with a given value of said binary signal supplied to the base of said one of said control transistors, said switchover means comprises two switching transistors of the same conductivity type as said driving transistors with collectors respectively connected to the emitters of said driving transistors, with emitters connected in parallel to said principal current generator and with bases connected to respective biasing circuits extending between said input stage and said second terminal, and two supplemental current generators respectively connected between said second terminal and the emitters of said driving transistors; and wherein said ancillary current generator and said supplemental current generators are of substantially lower power than said principal current generator, wherein said biasing circuits include the forward resistances of respective diodes inserted between said input stage and the bases of said switching transistors, wherein said input stage further includes a pair of pilot transistors respectively inserted between said first terminal and the bases of said control transistors, said pilot transistors being respectively responsive to said binary signal and to said reference voltage, each of said diodes connected between the base of a respective control transistor and the base of the switching transistor in series with the driving transistor coupled to the respective control transistor, and a further diode inserted with forward conductivity between said firt terminal and the resistors connected to the collectors of said control transistors.

* * * * *